United States Patent
Yang et al.

(10) Patent No.: US 7,889,551 B2
(45) Date of Patent: Feb. 15, 2011

(54) PAGE BUFFER OF NON-VOLATILE MEMORY DEVICE AND PROGRAMMING METHOD OF NON-VOLATILE MEMORY DEVICE

(75) Inventors: Chang Won Yang, Incheon (KR); Jong Hyun Wang, Cheongju-si (KR); Se Chun Park, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 203 days.

(21) Appl. No.: 12/130,962

(22) Filed: May 30, 2008

(65) Prior Publication Data

US 2009/0161443 A1    Jun. 25, 2009

(30) Foreign Application Priority Data

Dec. 24, 2007    (KR) .................. 10-2007-136365

(51) Int. Cl.
G11C 16/04    (2006.01)
(52) U.S. Cl. .............. 365/185.03; 365/185.25; 365/185.17; 365/185.18
(58) Field of Classification Search ........... 365/185.03, 365/185.25, 185.17, 185.18
See application file for complete search history.

(56) References Cited

U.S. PATENT DOCUMENTS

| | | | | |
|---|---|---|---|---|
| 5,625,590 A * | 4/1997 | Choi et al. | ............. | 365/185.17 |
| 6,614,688 B2 * | 9/2003 | Jeong et al. | ............. | 365/185.18 |
| 2008/0266961 A1 * | 10/2008 | Joo | ..................... | 365/185.12 |

FOREIGN PATENT DOCUMENTS

| | | |
|---|---|---|
| JP | 2007-280505 | 10/2007 |
| KR | 1020040078785 A | 9/2004 |
| KR | 1020060124856 A | 12/2006 |
| KR | 1020070069348 A | 7/2007 |

* cited by examiner

Primary Examiner—Connie C Yoha
(74) Attorney, Agent, or Firm—Kilpatrick Townsend & Stockton LLP

(57) ABSTRACT

A page buffer includes a first register, a second register and a data I/O unit. The first register temporarily stores data to be programmed into cells included in a first memory cell block group, or reads and stores data of a corresponding memory cell. The second register temporarily stores data to be programmed into cells included in a second memory cell block group, or reads and stores data of a corresponding memory cell. The data I/O unit inputs specific data to the first register and the second register, or outputs data stored in the first register and the second register.

10 Claims, 7 Drawing Sheets

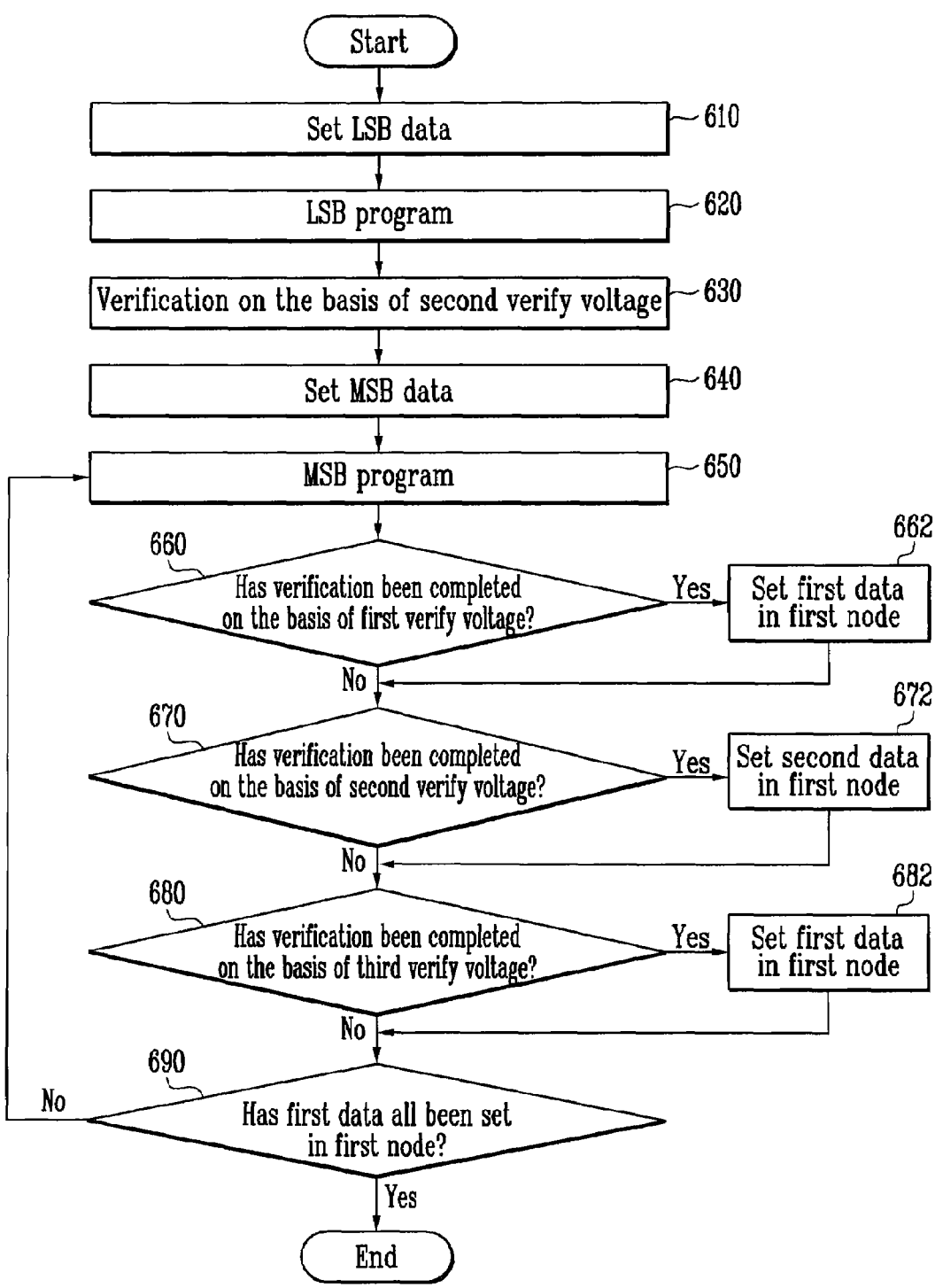

PAGE BUFFER OF NON-VOLATILE MEMORY DEVICE AND PROGRAMMING METHOD OF NON-VOLATILE MEMORY DEVICE

CROSS-REFERENCES TO RELATED APPLICATIONS

The present application claims priority to Korean patent application number 10-2007-136365, filed on Dec. 24, 2007, which is incorporated by reference in its entirety.

BACKGROUND OF THE INVENTION

The present invention relates to a page buffer of a non-volatile memory device with an improved structure and a programming method of the non-volatile memory device.

In recent years, there has been an increasing demand for non-volatile memory devices which can be programmed and erased electrically and do not need a refresh function of rewriting data at certain intervals. To enhance the level of integration of memory devices, more than one bit of data is stored in one cell.

The non-volatile memory device typically includes a memory cell array in which cells having data stored therein are arranged in matrix form, and a page buffer for writing memory into specific cells of the memory cell array and reading memory stored in specific cells. The page buffer includes a bit line pair connected to a specific memory cell, a register for temporarily storing data to be written into a memory cell array or temporarily storing data of a specific cell, which is read from a memory cell array, a sense node for sensing a voltage level of a specific bit line or register, and a bit line select unit for controlling whether the specific bit line is connected to the sense node.

In a typical page buffer structure, as the line width of a fabrication process decreases and the level of integration increases, capacitance between bit lines increases and a load on each bit line also increases. To solve these problems, there is a need to provide a non-volatile memory device that is able to reduce the load on the bit lines by improving the structure of the memory cell array and the page buffer.

The improved page buffer includes two registers, both of which are responsible for upper and lower memory cells, respectively. Thus, a multi-level cell program of a specific cell is performed using only one register. However, only one register can be vulnerable to the multi-level cell program. Accordingly, there is a need to provide a programming method enabling a multi-level cell program with only one register.

BRIEF SUMMARY OF THE INVENTION

The present invention is directed towards a non-volatile memory device that includes a page buffer and two registers. The page buffer is disposed at central portion of the memory device, one of the registers is responsible for upper memory cells and the other register is responsible for lower memory cells.

The present invention is also directed towards a programming method of the non-volatile memory device.

The present invention is further directed towards a multi-level cell programming method of the non-volatile memory device.

A page buffer according to an aspect of the present invention includes a first register, a second register and a data I/O unit. The first register temporarily stores data to be programmed into cells included in a first memory cell block group, or reads and stores data of a corresponding memory cell. The second register temporarily stores data to be programmed into cells included in a second memory cell block group, or reads and stores data of a corresponding memory cell. The data I/O unit inputs specific data to the first register and the second register, or outputs data stored in the first register and the second register.

A programming method of a non-volatile memory device according to an aspect of the present invention includes providing a page buffer including a first register connected to a first memory cell block group and a second register connected to a second memory cell block group. Data to be stored in the first memory cell block group is stored in the second register. The data stored in the second register is transmitted to the first register. Data to be stored in the second memory cell block group is stored in the second register. Cells included in the first memory cell block group or cells included in the second memory cell block group are programmed according to data stored in each register.

A programming method of a non-volatile memory device according to another aspect of the present invention includes providing a page buffer including a first register connected to a first memory cell block group and a second register connected to a second memory cell block group. A least significant bit (LSB) program of each memory cell is completed. A most significant (MSB) data is set in a first node of a data latch unit of the first register. An MSB program is performed at a first verify voltage or higher. A first data is set in the first node when the MSB program is performed at a second verify voltage or higher. A second data is set in the first node at a level which is opposite to that of the first data. When the MSB program is performed at a third verifies voltage or higher, the first data is set in the first node. The MSB program is repeated according to data set in the first node.

BRIEF DESCRIPTION OF THE DRAWINGS

FIG. 6 is a flowchart illustrating a multi-level cell programming method according to an embodiment of the present invention;

DESCRIPTION OF SPECIFIC EMBODIMENTS

Specific embodiments according to the present invention will be described with reference to the accompanying drawings. However, the present invention is not limited to the disclosed embodiments, but may be implemented in various configurations. The embodiments are provided to complete the disclosure of the present invention and to allow those having ordinary skill in the art to understand the present invention. The present invention is defined by the scope of the claims.

Figure 1:
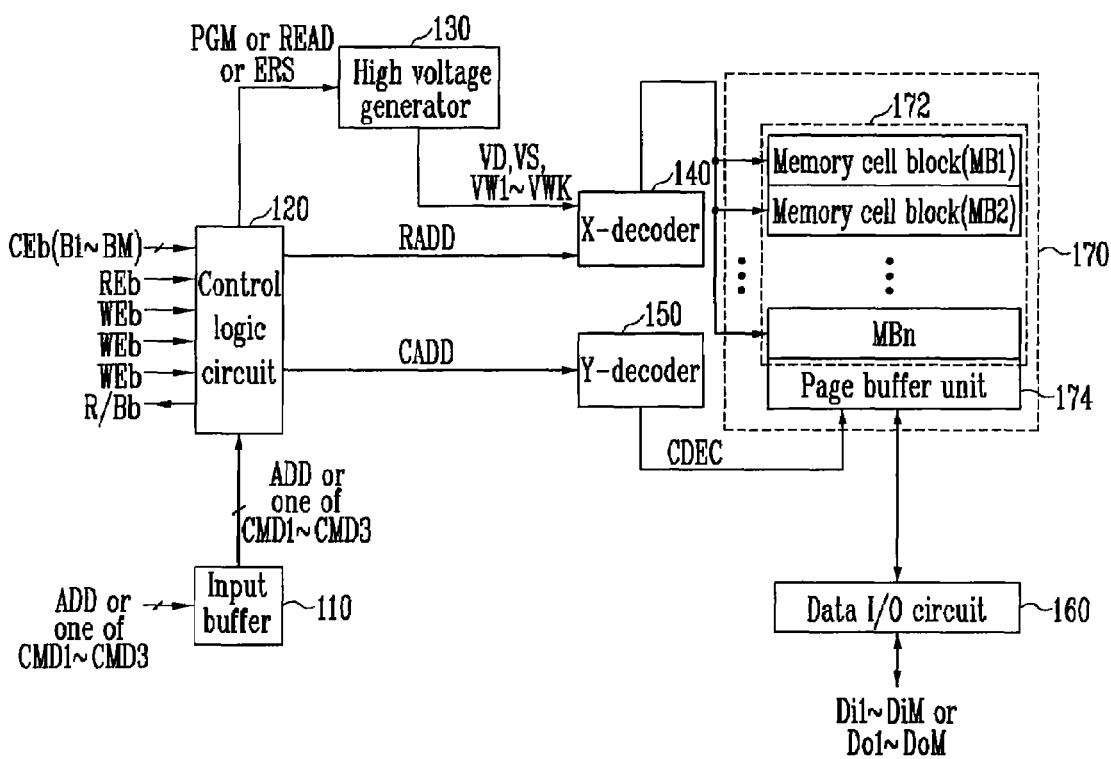
FIG. 1 is a block diagram of a typical non-volatile memory device.

FIG. 1 is a block diagram of a typical non-volatile memory device.

A non-volatile memory device 100 includes an input buffer 110, a control logic circuit 120, a high voltage generator 130, an X-decoder 140, a Y-decoder 150, a plane 170 including a plurality of memory blocks, and a page buffer unit 174 for temporarily storing data to be input to the memory blocks.

The input buffer 110 receives an external address signal ADD or a command signal (CMD1, CMD2 or CMD3) and outputs the received signal to the control logic circuit 120.

The control logic circuit 120 receives the command signal (CMD1, CMD2 or CMD3) or the external address signal ADD in response to a chip enable signal CEb and control signals REb, WEb, ALE and CLE, and generates a program command PGM, a read command READ or an erase command ERS in response thereto. The control logic circuit 120 outputs a ready/busy bar signal R/Bb for a predetermined time period when a command signal including a confirm code is received after a specific command is generated.

The high voltage generator 130 generates bias voltages VD, VS and VW1-VWK (where K is an integer) in response to the program command PGM, the read command READ or the erase command ERS.

The X-decoder 140 selects one of memory cell blocks MB1-MBn included in the plane 170 based on a row address signal RADD and supplies the bias voltages VD, VS and VW1-VWK to a selected memory cell block. The X-decoder 140 decodes the row address signal RADD, generates a row decoding signal, and selects one of the memory cell blocks MB1-MBn based on the row decoding signal.

The Y-decoder 150 decodes a column address signal CADD, generates a column decoding signal CDEC, and outputs the column decoding signal CDEC to the page buffer unit 174.

The page buffer unit 174 temporarily stores data to be programmed into the memory blocks, or reads and temporarily stores data stored in the memory blocks. Specifically, the page buffer unit latches one of input data Di1-DiM (where M is an integer) received from a corresponding data I/O circuit 160, selects a part or all of bit lines (not shown) of a corresponding plane in response to the column decoding signal CDEC, and latches one of output data Do1-DoM (where M is an integer) received from the selected bit lines. Although only one plane is illustrated in the drawing, one having ordinary skill in the art would understand that a multi-plane type construction, in which a plurality of planes having the same shape are connected in parallel, is also possible.

The data I/O circuit 160 transfers the externally input data Di1-DiM to each page buffer unit or consecutively outputs the output data Do1-DoM received from the page buffer unit.

The typical non-volatile memory device has a structure in which the memory cell blocks are connected only in one direction on the basis of the page buffer unit. Thus, as the line width of a fabrication process decreases and the level of integration increases, a load on each bit line connected between the page buffer unit and the memory cell also increases.

In order to solve this problem, the present invention proposes a structure in which a page buffer is disposed at a center of the memory cell array and memory cell blocks are connected in both directions on the basis of the page buffer.

Figure 2:
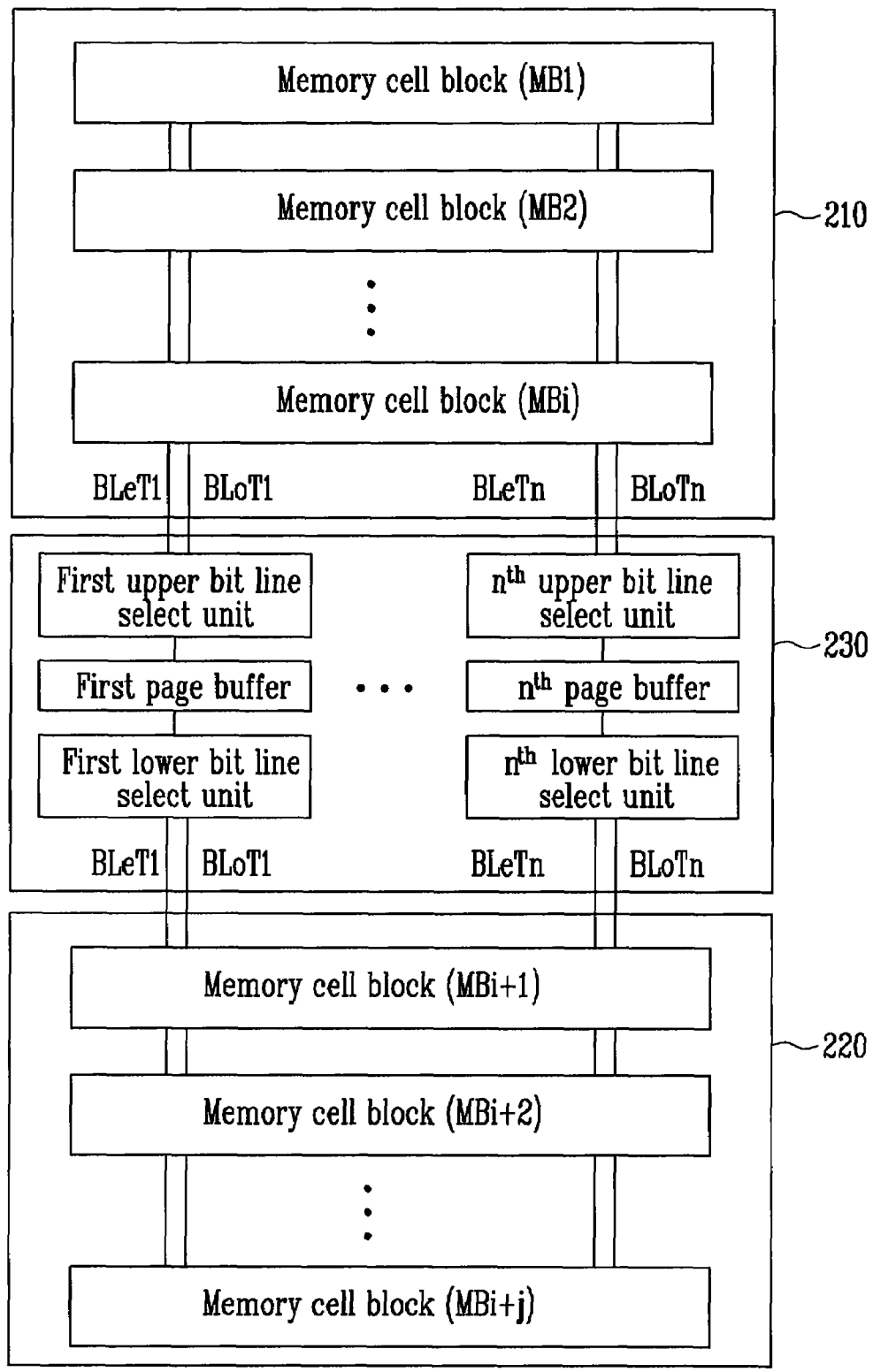
FIG. 2 is a view illustrating a connection relationship between memory cell blocks and page buffer units of a non-volatile memory device according to an embodiment of the present invention.

FIG. 2 is a view illustrating a connection relationship between memory cell blocks and page buffer units of a non-volatile memory device according to an embodiment of the present invention.

A non-volatile memory device 200 includes a page buffer unit 230 including a plurality of page buffers and bit line select units, a first memory cell block group 210 including memory cell blocks disposed on an upper side of the page buffer unit, and a second memory cell block group 220 including memory cell blocks disposed on a lower side of the page buffer unit.

The first memory cell block group 210 includes a plurality of memory cell blocks MB1 to MBi disposed on the upper side of the page buffer unit 230. The memory cell blocks and the page buffers are connected through upper bit lines BLeT1, BLoT1, . . . , BLeTn, BLoTn, respectively.

The second memory cell block group 220 includes a plurality of memory cell blocks MBi+1 to MBi+j disposed on the lower side of the page buffer unit 230. The memory cell blocks and the page buffers are connected through lower bit lines BLeB1, BLoB1, . . . , BLeBn, BLoBn, respectively.

The number of the memory cell blocks belonging to the first memory cell block group may be the same as the number of the memory cell blocks belonging to the second memory cell block group. That is, a condition where i=j is established.

The page buffer unit 230 includes a plurality of page buffers (first to $n^{th}$ page buffers), upper bit line select units (first to $n^{th}$ upper bit line select units), and lower bit line select units (first to $n^{th}$ lower bit line select units). The upper bit line select units connect a bit line of a specific cell, included in the first memory cell block group, and a page buffer. The lower bit line select units connect a bit line of a specific cell, included in the second memory cell block group, and a page buffer.

As described above, the page buffers are disposed at the center of the non volatile memory device 200 and the memory cell blocks are connected in both directions on the basis of the page buffers.

To adopt the above construction, the page buffer of the present invention differs from that of the prior art, as described below.

Figure 3:
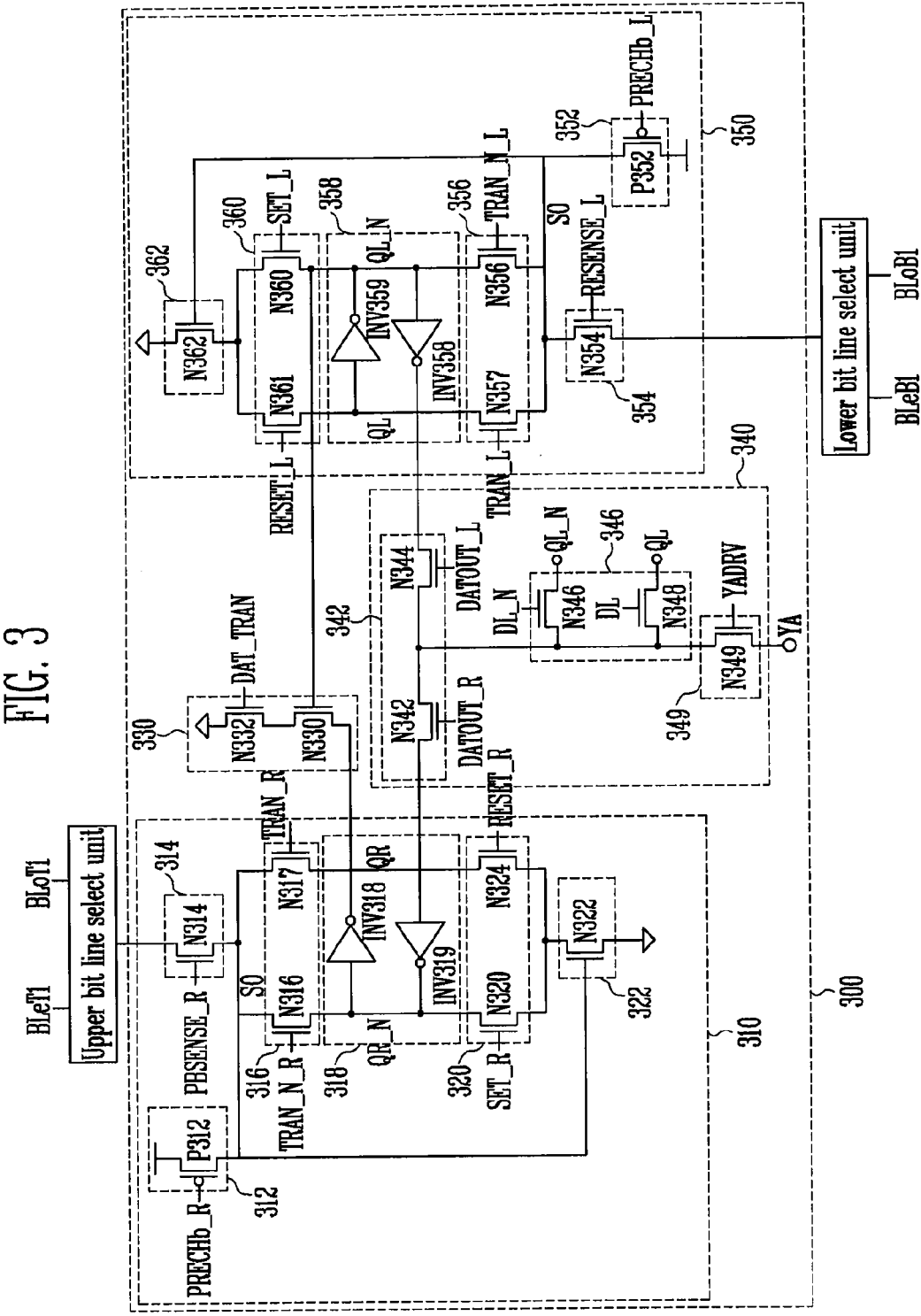
FIG. 3 is a circuit diagram of a page buffer according to an embodiment of the present invention.

FIG. 3 is a circuit diagram of a page buffer according to an embodiment of the present invention.

A page buffer 300 includes a first register 310, a second register 350, a data I/O unit 340, and an inter-register data transfer unit 330. The first register 310 temporarily stores data to be programmed into a memory cell connected to the upper bit line select unit, or reads and stores data stored in a corresponding memory cell. The second register 350 temporarily stores data to be programmed into a memory cell connected to the lower bit line select unit, or reads and stores data stored in a corresponding memory cell. The data I/O unit 340 receives data, which will be stored in each memory cell, through the first register and the second register and outputs data of a memory cell, which is read through the first register 310 and the second register 350. The inter-register data transfer unit 330 transmits data stored in the second register 350 to the first register 310.

The first register 310 and the second register 350 have the same construction except for various control signals. The first register 310 is connected to cells included in the first memory cell block group, and the second register 350 is connected to cells included in the second memory cell block group.

The first register 310 includes a bit line sensing unit 314, a sense node precharge unit 312, a data latch unit 318, a data transfer unit 316, a data setting unit 320 and a sense node sensing unit 322. The bit line sensing unit 310 selectively connects the bit line and a sense node SO in read/verify operations and senses data stored in a specific cell. The sense node precharge unit 312 applies a power supply voltage of a high level to the sense node SO. The data latch unit 318 temporarily stores data, which will be programmed into a specific cell, or temporarily stores data read from a specific cell. The data transfer unit 316 applies data stored in the data latch unit to the sense node SO. The data setting unit 320 inputs data to be stored in the data latch unit 318. The sense node sensing unit 322 applies a ground voltage to a specific node of the data latch unit 318 according to the level of the sense node SO.

The bit line sensing unit 314 selectively connects the upper bit line select unit and the sense node SO in response to a bit line sensing signal PBSENSE_R. The bit line sensing unit 314 includes an NMOS transistor N314 connected between the upper bit line select unit and the sense node SO. A detailed operation of the bit line sensing unit 314 is described later.

The sense node precharge unit 312 applies a high-level voltage VDD to the sense node SO in response to a precharge signal PRECHb_R. The sense node precharge unit 312 includes a PMOS transistor P312 connected between a power supply voltage terminal VDD and the sense node SO. A detailed operation of the sense node precharge unit 312 is described later.

The data latch unit 318 temporarily stores data to be programmed into a specific cell or temporarily stores data read from a specific cell. An output terminal of a first inverter INV318 is connected to an input terminal of a second inverter INV319, and an output terminal of the second inverter INV319 is connected to an input terminal of the first inverter INV318.

A node at which the output terminal of the first inverter INV318 is connected to the input terminal of the second inverter INV319 is referred to as a first node QR. A node where the output terminal of the second inverter INV319 is connected to the input terminal of the first inverter INV318 is referred to as a second node QR_N.

When high-level data is applied to the first node QR, the data is inverted by the second inverter, such that low-level data is applied to the second node QR_N. The low-level data is then inverted by the first inverter. Thus, a data retention effect is generated in which high-level data applied to the first node QR remains intact. In contrast, when low-level data is applied to the first node QR, the data is inverted by the second inverter, such that high-level data is applied to the second node QR_N. The high-level data is then inverted by the first inverter, such that a data retention effect is generated in which the low-level data applied to the first node QR remains intact.

The data transfer unit 316 selectively applies data, which is stored in the first node QR or the second node QR_N of the data latch unit 318, to the sense node SO. The data transfer unit 316 includes a first transfer transistor N317 for selectively connecting the first node QR and the sense node SO, and a second transfer transistor N316 for selectively connecting the second node QR_N and the sense node SO.

The first transfer transistor N317 transmits data, which is stored in the first node QR, to the sense node SO in response to a first data transmission signal TRAN_R. The second transfer transistor N316 transmits data, which is stored in the second node QR_N, to the sense node SO in response to a second data transmission signal TRAN_N_R.

Thus, to transmit data stored in the first node to the sense node, the first data transmission signal of a high level is applied. Likewise, to transmit data stored in the second node to the sense node, the second data transmission signal of a high level is applied.

The data setting unit 320 includes a first data setting transistor N321 for applying a ground voltage to the first node QR of the data latch unit 318 and a second data setting transistor N320 for applying a ground voltage to the second node QR_N of the data latch unit 318.

The first data setting transistor N321 is connected between the sense node sensing unit 322 and the first node. The first data setting transistor N321 applies a ground voltage, which is transmitted from the sense node sensing unit 322, to the first node in response to a first data set signal RESET_R.

The second data setting transistor N320 is connected between the sense node sensing unit 322 and the second node. The second data setting transistor N320 applies a ground voltage, which is transmitted from the sense node sensing unit 322, to the second node in response to a second data set signal SET_R.

The sense node sensing unit 322 applies the ground voltage to the data setting unit 320 according to the voltage level of the sense node. The sense node sensing unit 322 includes an NMOS transistor N322 connected between the data setting unit 320 and the ground terminal.

The ground voltage is applied to the data setting unit according to the voltage level of the sense node. When the voltage level of the sense node is at a high level, the sense node sensing unit 322 applies the ground voltage to the data setting unit. If the first data set signal RESET_R of a high level is applied, the ground voltage is applied to the first node QR. Thus, low-level data is applied to the first node. However, if the second data set signal SET_R of a high level is applied, the ground voltage is applied to the second node QR_N. Thus, high-level data is applied to the first node.

The second register 350 includes a bit line sensing unit 354, a sense node precharge unit 352, a data latch unit 358, a data transfer unit 356, a data setting unit 360, and a sense node sensing unit 362. The bit line sensing unit 354 selectively connects the bit line and a sense node SO in read/verify operations and senses data stored in a specific cell. The sense node precharge unit 352 applies the power supply voltage of a high level to the sense node. The data latch unit 358 temporarily stores data to be programmed into a specific cell or temporarily stores data read from a specific cell. The data transfer unit 356 applies data stored in the data latch unit 358 to the sense node SO. The data setting unit 360 inputs data to be stored in the data latch unit 358. The sense node sensing unit 362 applies a ground voltage to a specific node of the data latch unit 358 according to the level of the sense node SO.

The bit line sensing unit 354 selectively connects the lower bit line select unit and the sense node SO in response to a bit line sensing signal PBSENSE_L. The bit line sensing unit 354 includes an NMOS transistor N354 connected between the lower bit line select unit and the sense node SO. A detailed operation of the bit line sensing unit 354 is described later.

The sense node precharge unit 352 applies a high-level voltage VDD to the sense node SO in response to a precharge signal PRECHb_L. The sense node precharge unit 352 includes a PMOS transistor P352 connected between the power supply voltage terminal VDD and the sense node SO. A detailed operation of the sense node precharge unit 352 is described later.

The data latch unit 358 temporarily stores data to be programmed into a specific cell or temporarily stores data read from a specific cell. An output terminal of a first inverter INV358 is connected to an input terminal of a second inverter INV359, and an output terminal of the second inverter INV359 is connected to an input terminal of the first inverter INV358.

A node where the output terminal of the first inverter INV358 is connected to the input terminal of the second inverter INV359 is referred to as a first node QL, and a node where the output terminal of the second inverter INV359 is connected to the input terminal of the first inverter INV358 is referred to as a second node QL_N.

When high-level data is applied to the first node QL, corresponding data is inverted by the second inverter, such that low-level data is applied to the second node QL_N. The low-level data is then inverted by the first inverter again such that a data retention effect results in which the high-level data applied to the first node QL remains intact. In contrast, when low-level data is applied to the first node QL, corresponding data is inverted by the second inverter such that high-level data is applied to the second node QL_N. The high-level data is then inverted by the first inverter such that a data retention effect results in which the low-level data applied to the first node QL remains intact.

The data transfer unit 356 selectively applies data, which is stored in the first node QL or the second node QL_N of the data latch unit 358, to the sense node SO. The data transfer unit 356 includes a first transfer transistor N357 for selectively connecting the first node QL and the sense node SO, and a second transfer transistor N356 for selectively connecting the second node QL_N and the sense node SO.

The first transfer transistor N357 transmits data, stored in the first node, to the sense node in response to a first data transmission signal TRAN_L. The second transfer transistor N356 transmits data, stored in the second node, to the sense node in response to a second data transmission signal TRAN_N_L.

Thus, to transmit data stored in the first node to the sense node, the first data transmission signal of a high level is applied. Likewise, to transmit data stored in the second node to the sense node, the second data transmission signal of a high level is applied.

The data setting unit 360 includes a first data setting transistor N361 for applying a ground voltage to the first node QL of the data latch unit 358, and a second data setting transistor N360 for applying a ground voltage to the second node QL_N of the data latch unit 358.

The first data setting transistor N361 is connected between the sense node sensing unit 362 and the first node. The first data setting transistor N361 applies the ground voltage, which is transmitted from the sense node sensing unit 362, to the first node in response to a first data set signal RESET_L.

The second data setting transistor N360 is connected between the sense node sensing unit 362 and the second node. The second data setting transistor N360 applies the ground voltage, which is transmitted from the sense node sensing unit 362, to the second node in response to a second data set signal SET_L.

The sense node sensing unit 362 applies the ground voltage to the data setting unit 360 according to the voltage level of the sense node. The sense node sensing unit 362 includes an NMOS transistor N362 connected between the data setting unit 360 and the ground terminal.

Thus, the ground voltage is applied to the data setting unit 360 according to the voltage level of the sense node. When the voltage level of the sense node SO is at a high level, the sense node sensing unit 362 applies the ground voltage to the data setting unit 360. If the first data set signal RESET_L of a high level is applied, the ground voltage is applied to the first node QL. Thus, low-level data is applied to the first node. However, if the second data set signal SET_L of a high level is applied, the ground voltage is applied to the second node QL_N. Thus, high-level data is applied to the first node.

The data I/O unit 340 inputs specific data to the first and second registers or outputs data stored in the first and second registers.

The data I/O unit 340 includes a data output unit 342, a data input unit 346 and a data I/O control unit 349.

The data I/O control unit 349 includes an NMOS transistor N349 for connecting an I/O terminal YA, the data output unit 342 and the data input unit 346 in response to an I/O control signal YADRV.

When the I/O control signal of a high level is input, the NMOS transistor N349 is turned on to connect the I/O terminal YA, the data output unit 342 and the data input unit 346.

The data output unit 342 includes a NMOS transistor N342 for selectively connecting the first node QR of the first register 310 and the I/O terminal YA in response to a first data output signal DATOUT_R, and a NMOS transistor N344 for selectively connecting the first node QL of the second register 350 and the I/O terminal in response to a second data output signal DATOUT_L.

A data output process is described below in connection with a waveform.

Figure 4A:
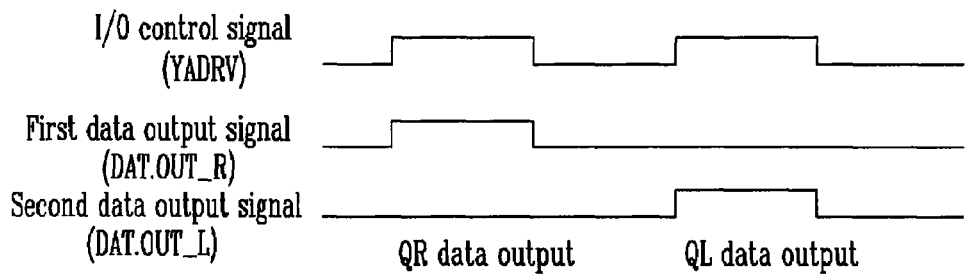
FIG. 4A shows a waveform illustrating a data output process according to an embodiment of the present invention.

FIG. 4A shows a waveform illustrating a data output process according to an embodiment of the present invention.

Upon data output, the first data output signal DATOUT_R or the second data output signal DATOUT_L is applied in a state where an I/O control signal YADRV of a high level is applied.

When the first data output signal DATOUT_R of a high level is applied, the first node QR of the first register 310 is connected to the I/O terminal such that data stored in the first node QR is output. When the second data output signal DATOUT_L of a high level is applied, the first node QL of the second register 350 is connected to the I/O terminal such that data stored in the first node QL is output.

The data input unit 346 includes an NMOS transistor N348 for selectively connecting the I/O terminal YA and the first node QL of the second register 350 in response to a first data input signal DL, and an NMOS transistor N346 for selectively connecting the I/O terminal and the second node QL_N of the second register 350 in response to a second data input signal DL_N.

Upon data input, a ground voltage is generally applied to the I/O terminal YA. If the first data input signal DL of a high level is applied in a state where the I/O control signal YADRV of a high level is applied, a ground voltage (i.e., data of a low level) is applied to the first node QL of the second register 350. If the second data input signal DL_N of a high level is applied in a state where the I/O control signal YADRV of a high level is applied, a ground voltage (i.e., data of a low level) is applied to the second node QL_N of the second register 350. Thus, low-level data is applied to the first node or the second node according to the input of the first data input signal and the second data input signal.

Data received through the data I/O unit 340 is stored in the second register 350. Through the process of moving the received data to the first register 310, data is input to the first register 310 by the inter-register data transfer unit 330.

The inter-register data transfer unit 330 includes an NMOS transistor N332 which is connected to the ground terminal and applies the ground voltage to the first node QR of the first register 310 in response to an inter-register data transmission signal DAT_TRAN, and an NMOS transistor N330 which is turned on according to the voltage level of the second node QL_N of the second register 350 and connected between the NMOS transistor N332 and the first node QR of the first register 310.

The inter-register data transfer unit 330 is operated when the inter-register data transmission signal DAT_TRAN of a high level is input thereto.

If low-level data is applied to the first node QL of the second register, high-level data is applied to the second node QL_N and the NMOS transistor N330 of the inter-register data transfer unit 330 is turned on in response thereto. Thus, the ground voltage is applied to the first node QR of the first register.

If high-level data is applied to the first node QL of the second register, low-level data is applied to the second node QL_N and the NMOS transistor N330 of the inter-register data transfer unit 330 is turned on in response thereto. Accordingly, an initial value of a high level, which is stored in the first node QR of the first register, remains intact.

The above process is described below in connection with a waveform.

Figure 4B:
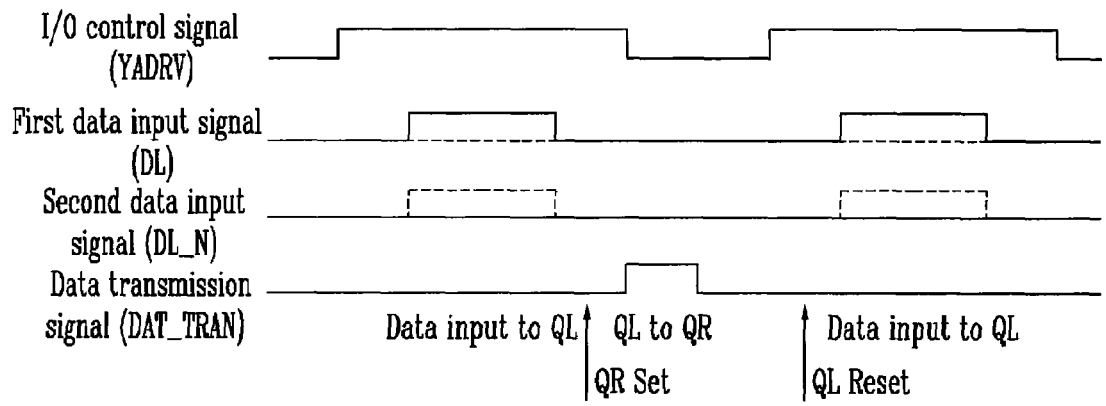
FIG. 4B shows a waveform illustrating a data input process according to an embodiment of the present invention.

FIG. 4B shows a waveform illustrating a data input process according to an embodiment of the present invention.

Data to be programmed is first input to the second register 350 through the first register 310.

The first data input signal DL or the second data input signal DL_N is applied in a state where the I/O control signal YADRV of a high level is applied.

Specific data is input to the first node QL of the second register 350 through this process.

The first register 310 is then reset before data is transmitted from the second register 350 to the first register 310. Specifically, the NMOS transistor N322 of the sense node sensing unit 322 is turned on by precharging the sense node to a high level through the sense node precharge unit 312.

If the second data set signal SET_R of a high level is applied, high-level data is reset in the first node QR.

Data stored in the first node QL of the second register 350 is then transmitted to the first node QR of the first register 310. For this purpose, the inter-register data transmission signal DAT_TRAN of a high level is applied.

If low-level data is applied to the first node QL of the second register 350, high-level data is applied to the second node QL_N and the NMOS transistor N330 of the inter-register data transfer unit 330 is turned on in response thereto. Thus, the ground voltage is applied to the first node QR of the first register 310.

If high-level data is applied to the first node QL of the second register 350, low-level data is applied to the second node QL_N and the NMOS transistor N330 of the inter-register data transfer unit 330 is turned off in response thereto. Accordingly, an initial value of a high level, which is stored in the first node QR of the first register 310, remains intact.

Data stored in the second register 350 is transmitted to the first register 310 through this process.

Data to be programmed is then input through the second register 350.

The first data input signal DL or the second data input signal DL_N is applied in a state where the I/O control signal YADRV of a high level is applied.

Specific data is input to the first node QL of the second register 350 through this process.

In accordance with embodiments of the present invention, in order to place a page buffer at the center of a non volatile memory device 200, memory cell blocks held responsible by the first register 310 and the second register 350 are clearly divided. In other words, data stored in the first register 310 is programmed into the first memory cell block group 210 and data stored in the second register 350 is programmed into the second memory cell block group 220. Accordingly, unlike a page buffer of a typical dual register structure, data to be input to a specific cell is set with only one register. However, this construction is not adequate for a multi-level cell program that has recently become widely used.

In the case of a multi-level cell non-volatile memory device in which two bits or more of data is programmed into one cell, the LSB program and the MSB program are performed. Before the MSB program operation is executed, an operation of determining the state by reading a LSB program state is performed. Thus, it is common to adopt a construction including two data latch units.

However, in embodiments of the present invention, this role is performed using only one register. A method of performing a multi-level cell program using only one register is described below.

Figure 5:
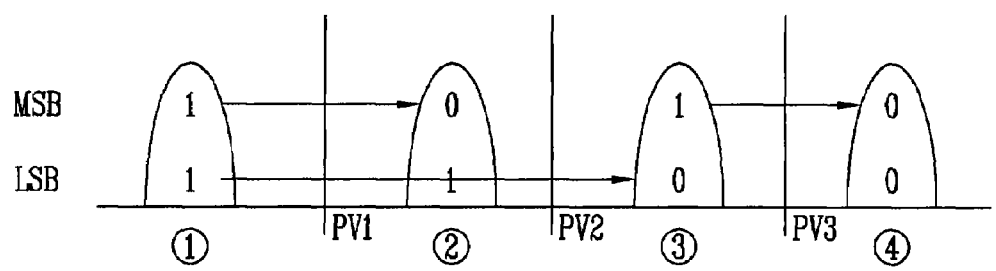
FIG. 5 shows threshold voltage distributions of a cell, for illustrating the sequence of a multi-level cell program, according to an embodiment of the present invention.

FIG. 5 shows threshold voltage distributions of a cell, for illustrating the sequence of a multi-level cell program, according to an embodiment of the present invention.

The present invention relates to a two-bit multi-level cell program.

A first state ① designates a state anterior to the LSB program and the MSB program. Data '11' is sequentially input to the page buffer of the non-volatile memory device.

A second state ② designates distributions when only the MSB program is executed without performing the LSB program. Data '10' is sequentially input to the page buffer of the non-volatile memory device.

A third state ③ designates distributions when only the LSB program is executed without performing the MSB program. Data '01' is sequentially input to the page buffer of the non-volatile memory device.

A fourth state ④ designates distributions when both the MSB program and the LSB program are executed. Data '00' is sequentially input to the page buffer of the non-volatile memory device.

A detailed sequence of the multi-level cell programming method is described below.

The programming method described below is an operation performed on each of the first register 310 and the second register 350 of FIG. 3. That is, the above operation can be performed using only the first register 310 or the second register 350. Hereinafter, the above operation is described with reference to the first register 310.

FIG. 6 is a flowchart illustrating a multi-level cell programming method according to an embodiment of the present invention.

LSB data is first set in step 610.

In other words, to program a LSB (data '00', '10'), low-level data is applied to the first node QR of the data latch unit 318.

However, in the case where a LSB is not programmed (data '11', '01'), high-level data is applied to the first node QR of the data latch unit 318.

A method of applying data to the first node is identical to that described in the previous data setting process through the inter-register data transfer unit 330.

A LSB program is then performed in step 620.

The sense node SO is precharged to a high level by employing the sense node precharge unit 312. The first data transmission signal TRAN_R of a high level is then applied such that data stored in the first node QR is applied to the sense node. To program a LSB (data '00', '10'), data of a low level is applied to the sense node such that the sense node is discharged to a low level. However, in the case where a LSB is not programmed (data '01', '11'), data of a high level is applied to the sense node such that the sense node maintains a high level. When a program voltage is applied to a word line, whether or not to perform the program is decided according to the voltage level of the sense node.

A verify operation is performed on the LSB program on the basis of a second verify voltage PV2 in step 630.

The sense node SO and the bit line are precharged to a high level by employing the sense node precharge unit 312.

The program is then verified by applying the second verify voltage PV2 to a word line including a cell to be verified. If it is verified that a corresponding cell has been programmed at the second verify voltage PV2 or higher, the cell is not turned on since the threshold voltage of the cell is higher than the second verify voltage PV2. Thus, a current path connecting from a bit line to a cell string is not formed. Accordingly, a corresponding bit line maintains a high-level voltage without change.

However, if it is verified that a corresponding cell has not been programmed at the second verify voltage PV2 or higher, the cell is turned on since the threshold voltage of the cell is lower than the second verify voltage PV2. Thus, a current path connecting from a bit line to a cell string is formed. Accordingly, a corresponding bit line is discharged to a low-level voltage.

In other words, if a corresponding cell has been programmed at the second verify voltage or higher, a corresponding bit line maintains a high-level voltage, but otherwise maintains a low-level voltage. A cell, which was not a target program subject, also maintains a low-level voltage. The voltage level of the bit line is applied to the sense node SO without change. The sense node sensing unit 322 and the data setting unit 320 are operated to reset data of the first node QR depending on whether or not the cell has been programmed.

When the cell has been programmed properly by the LSB program operation, the voltage level of the sense node SO maintains a high level. Thus, the voltage level of a high level is transferred to the sense node sensing unit 322 such that the ground voltage is applied to the data setting unit 320. The second data set signal SET_R of a high level is applied such that high-level data is stored in the first node QR. However, when the cell has not been programmed despite the LSB program operation, the voltage level of the sense node SO has shifted to a low level and, therefore, the sense node sensing unit 322 is not operated. Accordingly, data of the first node QR, which has been stored initially, remains intact.

In the case of a cell for which a LSB is a program subject, low-level data is stored in the first node QR. In the case of a cell for which a LSB is an erase subject, high-level data is stored in the first node QR.

Thus, in the case where a cell is a program subject and is programmed properly, data of the first node QR changes to high-level data. However, in the case where the cell is a program subject, but not programmed, the first node QR maintains low-level data without change. In the case of a cell that has been an erase subject, the cell maintains an initial high-level data without change.

When there are cells that have not been programmed according to the verify operation, the program operation is performed again.

The above program and verify operations are repeated until cells, which are program subjects and are fully programmed, have high-level data stored in the first node QR, irrespective of whether a specific cell is an erase subject or a program subject.

For the MSB program, MSB data is set in step 640.

In other words, to program a MSB (data '01', '00'), low-level data is applied to the first node QR of the data latch unit 318. Specifically, a high-level voltage is applied to the precharge unit to turn on the NMOS transistor N322 of the sense node sensing unit 322, and the first data set signal RESET_R of a high level is applied. Thus, a low-level voltage is applied to the first node QR of the data latch unit 318.

However, in the case where the MSB is not programmed (data '11', '10'), high-level data is applied to the first node QR of the data latch unit 318. Specifically, a high-level voltage is applied to the precharge unit to turn on the NMOS transistor N322 of the sense node sensing unit 322 and the second data set signal SET_R of a high level is applied. Thus, a high-level voltage is applied to the first node QR of the data latch unit 318.

An MSB program is then performed in step 650.

After the sense node SO is precharged to a high level by employing the sense node precharge unit 312, the first data transmission signal TRAN_R of a high level is applied. Thus, data stored in the first node QR is applied to the sense node. To program a MSB (data '01', '00'), low-level data is applied to the sense node and, therefore, the sense node is discharged to a low level. However, in the case where the MSB is not programmed (data '11', '10'), high-level data is applied to the sense node and, therefore, the sense node maintains a high level. When the program voltage is applied to a word line, whether to perform the MSB program is decided according to the voltage level of the sense node.

A verify operation of the MSB program is performed on the basis of first to third verify voltages PV1 to PV3 in steps 660 to 690. The verify operation is described in detail with reference to FIGS. 7A and 7B.

Figure 7A:
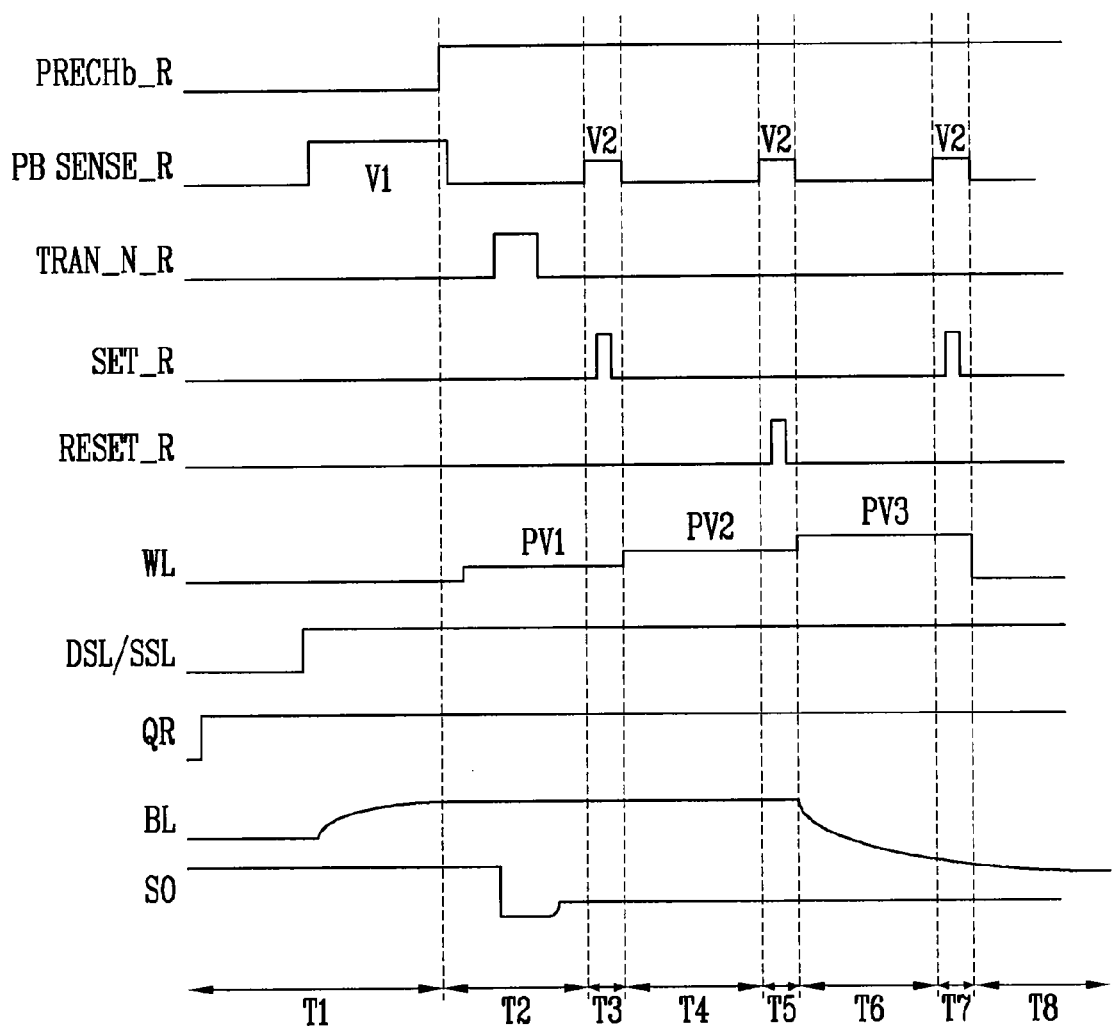
FIG. 7A shows a waveform of a verify operation when data set in a first node of a first register is at a high level.
Figure 7B:
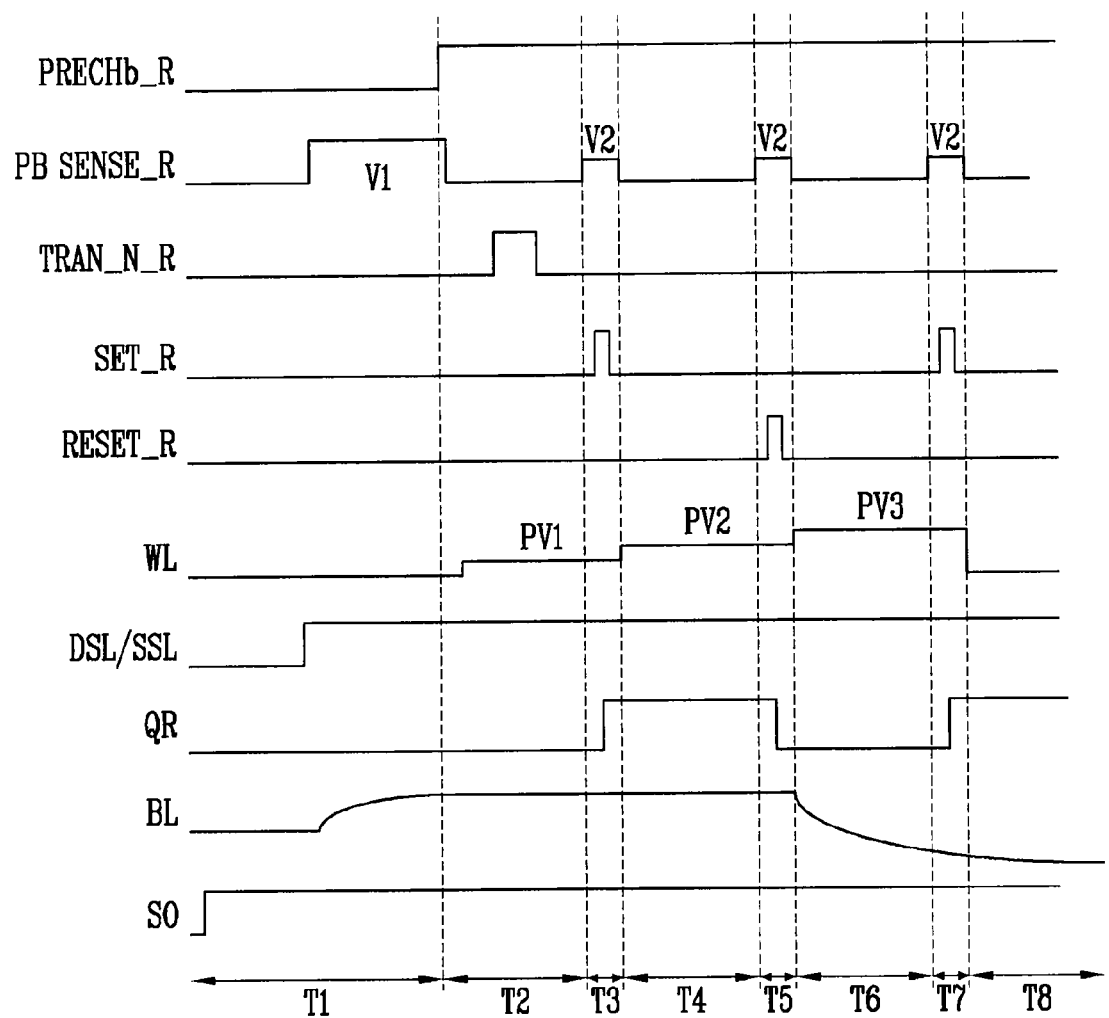
FIG. 7B shows a waveform of a verify operation when data set in the first node of the first register is at a low level.

FIG. 7A shows a waveform of the verify operation when data set in the first node QR is at a high level. FIG. 7B shows a waveform of the verify operation when data set the first node QR is at a low level.

The verify operation on the MSB program is first performed on the basis of the first verify voltage in step 660.

The sense node SO and the bit line are precharged to a high level by employing the sense node precharge unit 312 (T1 period).

The drain select signal DSL and the source select signal SSL of a high level are applied to connect the bit line and a cell string, which is then connected to a common source line. The bit line sensing signal PBSENSE_R of a first voltage level V1 is applied to connect the sense node and the bit line. Thus, the voltage of the bit line BL gradually rises, as shown in FIG. 7A.

Thereafter, the precharge operation of the sense node is stopped and the voltage level of the bit line is evaluated depending on whether a specific cell has been programmed on the basis of the first verify voltage (T2 period).

The precharge signal PRECHb_R of a high level is applied and the first verify voltage PV1 is applied to a selected word line. An unselected word line is applied with a pass voltage (not shown).

The voltage level of a bit line is changed depending on whether a corresponding cell has been programmed. In the case where a corresponding cell has been programmed (i.e., when the threshold voltage is higher than the first verify voltage), the voltage level of the bit line maintains a high level as in the verify operation on the LSB program. In the case where a corresponding cell has not been programmed (i.e., when the threshold voltage is lower than the first verify voltage), the voltage level of the bit line shifts to a low level.

In this period, the sense node is in a floating state. An operation for shifting the voltage level of the sense node to a low level is performed with respect to cells not requiring verification by employing the sense node in a floating state. That is, when high-level data has been applied to the first node QR (i.e., a cell which is an erase subject cell or a program subject cell and has been verified to be programmed), an additional verify operation or program operation is not required. Accordingly, the voltage level of the sense node shifts to a low level.

The second data transmission signal TRAN_N_R of a high level is applied for a predetermined time period. Accordingly, data stored in the first node QR is inverted and applied to the sense node. In the case where high-level data has been stored in the first node (in the case of FIG. 7A), the sense node shifts to a low level, as shown in FIG. 7A.

As described above, after the sense node shifts to a low level, verification is performed in each period, but the voltage level of the sense node does not rise to a high level again. Thus, the sense node sensing unit 322 does not operate and the high-level data stored in the first node QR remains intact.

Accordingly, cells not requiring verification (erase subject cells) or cells that have been successfully verified once are excluded from verification subjects through this operation.

The evaluation result on the basis of the first verify voltage is sensed (T3 period).

The bit line sensing signal PBSENSE_R of the second voltage level V2 is applied to the bit line sensing unit 314. Thus, in the case where a corresponding cell has been programmed at the first verify voltage or higher, the voltage level of the bit line is increased and the NMOS transistor N314 is not turned on. Thus, the voltage level of the sense node remains intact.

However, in the event that a corresponding cell has not been programmed at the first verify voltage or higher, the voltage level of the bit line is lowered and the NMOS transistor N314 is turned on. Thus, the voltage level of the sense node shifts to a low level.

Accordingly, whether the sense node sensing unit 322 will be operated is decided according to whether a specific cell has been programmed. That is, only when a specific cell has been programmed, the sense node sensing unit 322 operates and, therefore, the ground voltage is transferred to the data setting unit 320.

In this period, the second data set signal SET_R of a high level is applied. Thus, when a specific cell has been programmed, the ground voltage is applied to the second node QR_N and high-level data is stored in the first node QR.

In the case of FIG. 7A, high-level data is first stored in the first node QR and as the second data transmission signal TRAN_N_R is applied in the T2 period, the sense node shifts to a low level. In this case, the cell is excluded from a verification subject. Consequently, the high-level data of the first node QR remains intact.

In the case of FIG. 7B, low-level data is first stored in the first node QR (a program subject) and data applied to the first node QR is changed according to whether a corresponding cell has been programmed. If the cell is not programmed despite the program operation (that is, when the threshold voltage is lower than the first verify voltage), the low-level data remains intact in the first node QR.

However, if the cell is successfully programmed (that is, when the threshold voltage is higher than the first verify voltage), high-level data is stored in the first node QR.

In other words, in the case where the cell is programmed at the first verify voltage or higher by the program, the high-level data is stored and set in the first node QR in step 662. In the case where the cell is not programmed at the first verify voltage or higher by the program, data first stored in the first node QR remains intact. A verify operation is then performed on the basis of the second verify voltage.

A verify operation on the MSB program is then performed on the basis of the second verify voltage in step 670.

The voltage level of the bit line is first evaluated on the basis of the second verify voltage PV2 according to whether a specific cell has been programmed (T4 period).

A selected word line is applied with the second verify voltage PV2 and an unselected word line is applied with a pass voltage (not shown).

The voltage level of a bit line is changed according to whether or not a corresponding cell is programmed. When a corresponding cell has been programmed (i.e., when the threshold voltage is higher than the second verify voltage), the voltage level of the bit line maintains a high level. When a corresponding cell has not been programmed (i.e., when the threshold voltage is lower than the second verify voltage), the voltage level of the bit line shifts to a low level.

The evaluation result on the basis of the second verify voltage is sensed (T5 period).

The bit line sensing unit 314 is applied with the bit line sensing signal PBSENSE_R of a second voltage level V2. When a corresponding cell has been programmed at the second verify voltage or higher, the voltage level of the bit line is high and the NMOS transistor N314 is not turned on. Thus, the voltage level of the sense node remains intact.

However, when a corresponding cell has not been programmed at the second verify voltage or higher, the voltage level of the bit line is low and the NMOS transistor N314 is turned on. Thus, the voltage level of the sense node shifts to a low level.

Thus, whether or not the sense node sensing unit 322 will be operated is decided according to whether a specific cell has been programmed. That is, only when a specific cell has been programmed, the sense node sensing unit 322 is operated and transfers the ground voltage to the data setting unit 320.

In this period, the first data set signal RESET_R of a high level is applied. Thus, when a specific cell has been programmed, the ground voltage is applied to the first node QR and low-level data is stored in the first node QR.

In this period, unlike the previous period T3, the first data set signal RESET_R is applied. This is an important feature of the present invention and is described in more detail below.

Referring back to FIG. 5, distributions of the first state '11' and the third state '10' are formed by the LSB program. If a MSB program is performed on the first state '11' and the third state '10', the second state '01' and the fourth state '00' are formed, resulting in a total of the four states.

The second state results from the program on the first state and the fourth state results from the program on the third state.

In the step (640) of setting MSB data in the first node QR in preparation for the MSB program, the same data of a low level is applied irrespective of whether a target state to be programmed is the second state or the fourth state. Thus, if verification is performed without any information about whether the target state is the second state or the fourth state, a problem may arise because the verification is finished when the program is performed at the first verify voltage PV1 or higher in the case where the fourth state is a target. In other words, it is necessary to verify the two states by dividing them.

In the prior art, before the MSB program operation is performed, an operation for dividing states by reading LSB program states was performed. Further, a construction employing two data latch units was adopted. However, the present invention proposes a method of dividing the states using only one data latch unit.

After the LSB program is finished, distributions of the first state and the third state remain. Thus, to program at the fourth state, corresponding cells already have a threshold voltage higher than the second verify voltage before the MSB program.

That is, although low-level data is applied to the first node in the same manner, when the program is performed at the second state, corresponding cells can be distributed between the first verify voltage and the second verify voltage. However, when the program is performed at the fourth state, corresponding cells are distributed between the second verify voltage and the third verify voltage. Consequently, the distributions of the threshold voltages of the corresponding cells differ.

After verification based on the first verify voltage is performed by employing this phenomenon, verification based on the second verify voltage is performed. In other words, to program at the second state, verification is finished when the program is performed at the first verify voltage or higher. In the previous steps 660 and 662, when the program is performed at the first verify voltage or higher, data of the first node is set to a high level. However, this is the same as when the program is performed at the fourth state. Thus, additional measures have to be taken.

That is, cells to be programmed at the fourth state have already been programmed at the second verify voltage or higher. When the threshold voltage is higher than the second verify voltage as a result of verification on the basis of the second verify voltage, the cells are considered to be cells that will be programmed at the fourth state and the data of the first node is set to a level opposite to that in steps 660, 662.

In other words, after the program is finished at the first verify voltage or higher, the cells are classified into cells to be programmed at the second state and cells to be programmed at the fourth state by performing verification on the basis of the second verify voltage. The cells to be programmed at the second state no longer need any program. Thus, the high-level data stored in the first node remains intact. In the case of the cells to be programmed at the fourth state, the threshold voltage of the cells need to be increased to the third verify voltage or higher. Thus, the high-level data stored in the first node shifts to low-level data.

Accordingly, if it is verified that the cells have been programmed at the second verify voltage or higher through the verify operation on the basis of the second verify voltage, the first data set signal RESET_R is applied as a high level such that low-level data is set in the first node.

If it is verified that the cells have not been programmed at the second verify voltage or higher, the sense node sensing unit 322 does not operate and, therefore, data stored in the first node remains intact.

Referring back to FIG. 7B, it is determined that the cells have been programmed at the second verify voltage or higher as a result of the verification (i.e., a case where the cells are to be programmed at the fourth state). The data of the first node QR was set to low-level data. If the cells have been programmed at the second verify voltage or lower as a result of the verification (i.e., a case where the cells are to be programmed at the second state), the data of the first node QR maintains a high level.

In other words, in the event that the cells are programmed at the second verify voltage or higher by the program, low-level data is stored and set in the first node QR in step 672. In the event that the cells are not programmed at the second verify voltage or higher by the program, data initially stored in the first node QR remains intact. A verify operation on the basis of a third verify voltage is then performed.

A verify operation on the MSB program on the basis of the third verify voltage is performed in step 680.

The voltage level of the bit line is evaluated according to whether a specific cell has been programmed on the basis of the third verify voltage PV3 (T6 period).

For this purpose a selected word line is applied with the third verify voltage PV3 and an unselected word line is applied with a pass voltage (not shown). The voltage level of a bit line is evaluated according to whether a specific cell has been programmed on the basis of the third verify voltage.

The voltage level of the bit line is changed according to whether a corresponding cell has been programmed. If a corresponding cell has been programmed (i.e., when the threshold voltage is higher than the third verify voltage), the voltage level of the bit line maintains a high level. However, if a corresponding cell has not been programmed (i.e., when the threshold voltage is lower than the third verify voltage), the voltage level of the bit line shifts to a low level.

The evaluation result is sensed on the basis of the third verify voltage (T7 period).

The bit line sensing unit 314 is applied with the bit line sensing signal PBSENSE_R of the second voltage level V2. In the case where a corresponding cell has been programmed at the third verify voltage or higher, the voltage level of the bit line is high and, therefore, the NMOS transistor N314 is not turned on. Thus, the voltage level of the sense node remains intact.

In the case where a corresponding cell has not been programmed at the third verify voltage or higher, the voltage level of the bit line is low and, therefore, the NMOS transistor N314 is turned on. Thus, the voltage level of the sense node shifts to a low level.

Accordingly, whether the sense node sensing unit 322 is operated is decided according to whether or not a specific cell has been programmed. That is, only when a specific cell is programmed, the sense node sensing unit 322 is operated and, thus, transfers the ground voltage to the data setting unit 320.

In this period, the second data set signal SET_R of a high level is applied. Thus, when a specific cell has been programmed, the ground voltage is applied to the second node QR_N and high-level data is stored in the first node QR.

Referring back to FIG. 7B, the low-level data was stored in the first node QR as a result of the sensing in the previous period (i.e., a program subject). The data applied to the first node QR is changed according to whether a corresponding cell has been programmed. If the cell has not been programmed despite the program operation (i.e., when the threshold voltage is lower than the third verify voltage), low-level data remains intact in the first node QR.

However, if the cell has been successfully programmed (i.e., when the threshold voltage is higher than the third verify voltage), high-level data is stored in the first node QR.

In other words, in the case where the cell has been programmed at the third verify voltage or higher by the program, high-level data is stored and set in the first node QR in step 682. However, in the case where the cell has not been programmed at the third verify voltage or higher by the program, data initially stored in the first node QR remains intact.

The data set in the first node QR is then read to determine whether the program has been completed in step 690.

As a result of sequentially performing the previous steps 660 to 690, when high-level data is set in the first node, it is determined that the program has been completed and the MSB program is finished.

However, when there is a page buffer in which low-level data is set in the first node, the MSB program operation is repeatedly performed.

This operation is performed on the basis of the voltage level of data stored in the first node of each page buffer. Though not shown in FIG. 3, a PMOS transistor having a gate terminal applied with the voltage of the first node and a source terminal connected to the power supply voltage is generally used for this operation. That is, whether a corresponding transistor is turned on is decided according to the voltage of the first node, and whether the power supply voltage is applied to the other terminal is decided according to the above decision result. Thus, the voltage level of the first node is determined based on the decision result. For example, when the voltage of the first node is at a low level, a corresponding transistor is turned on and the power supply voltage flows through the other terminal. When the voltage of the first node is at a high level, a corresponding transistor is turned off and becomes a floating state.

In other words, a multi-level cell programming method is made possible using only one register in accordance with the multi-level cell programming method described with reference to FIGS. 5 to 7.

Thus, a typical page buffer can be operated sufficiently through the page buffer of the present invention shown in FIG. 3.

As described above, according to the present invention, a page buffer is placed at central portion of a non volatile memory device. Accordingly, an overall length of a bit line connected between specific cells in a page buffer can be shortened. Thus, load on a specific bit line can be decreased and an instant peak current can be reduced. Consequently, a voltage drop phenomenon can be reduced and operating current consumption can be saved.

Further, a multi-level cell program is enabled using only one register. Accordingly, a multi-level cell program can be performed using the page buffer with the improved structure.

The present invention is not limited to the disclosed embodiments, but may be implemented in various configurations. The embodiments are provided to complete the disclosure of the present invention and to allow those having ordinary skill in the art to understand the present invention. The present invention is defined by the scope of the claims.

What is claimed is:

1. A page buffer comprising:
a first register for temporarily storing data to be programmed into cells included in a first memory cell block group, and for reading and storing data of a corresponding memory cell;
a second register for temporarily storing data to be programmed into cells included in a second memory cell block group, and for reading and storing data of a corresponding memory cell; and
a data I/O unit for inputting data to the first register and the second register, and for outputting data stored in the first register and the second register;
wherein the first register, the second register, and the data I/O unit are disposed between the first memory cell block group and the second memory cell block group.

2. The page buffer of claim 1, wherein the number of memory cell blocks of the first memory cell block group is identical to the number of memory cell blocks of the second memory cell block group.

3. The page buffer of claim 1, wherein the first register comprises:
a first bit line sensing unit for selectively connecting a bit line and a sense node, and for sensing data stored in a specific cell;
a first sense node precharge unit for applying a power supply voltage of a high level to the sense node;
a first data latch unit for temporarily storing data to be programmed into a specific cell, and for temporarily storing data read from a specific cell;
a first data transfer unit for applying data, stored in the first data latch unit, to the sense node;
a first data setting unit for inputting data to be stored in the first data latch unit; and
a first sense node sensing unit for applying a ground voltage to a specific node of the first data latch unit according to a level of the sense node.

4. The page buffer of claim 1, wherein the second register comprises:
a second bit line sensing unit for selectively connecting a bit line and a sense node, and for sensing data stored in a specific cell;
a second sense node precharge unit for applying a power supply voltage of a high level to the sense node;
a second data latch unit for temporarily storing data to be programmed into a specific cell, and for temporarily storing data read from a specific cell;
a second data transfer unit for applying data, stored in the second data latch unit, to the sense node;
a second data setting unit for inputting data to be stored in the second data latch unit; and
a second sense node sensing unit for applying a ground voltage to a specific node of the second data latch unit according to a level of the sense node.

5. The page buffer of claim 1, further comprising an inter-register data transfer unit for applying a ground voltage to the first register according to a level of the data stored in the second register.

6. The page buffer of claim 5, wherein the inter-register data transfer unit maintains the data stored in the first register when the data stored in the second register is at a low level, and applies the ground voltage to the first register such that low-level data is stored in the first register when the data stored in the second register is at a high level.

7. A programming method of a non-volatile memory device, the method comprising:
providing a page buffer including a first register connected to a first memory cell block group and a second register connected to a second memory cell block group;
storing first data in the second register;
transmitting the data stored in the second register to the first register;
storing second data in the second register; and
programming cells included in the first memory cell block group or cells included in the second memory cell block group according to data stored in each register.

8. The programming method of claim 7, wherein transmitting data to the first register comprises:
storing high-level data in a first node of a data latch unit of the first register; and
setting data of the first node of the first register according to a level of data stored in a first node of a data latch unit of the second register.

9. The programming method of claim 8, wherein setting the data comprises maintaining high-level data stored in the first node of the second register when data stored in the first node of the first register is at a high level.

10. The programming method of claim 8, wherein setting the data comprises shifting high-level data stored in the first node of the second register to low-level data when data stored in the first node of the first register is at a low level.

* * * * *